US008951373B2

United States Patent
Ota

(10) Patent No.: US 8,951,373 B2
(45) Date of Patent: Feb. 10, 2015

(54) REPLACEABLE PROTECTIVE LAYER ON FLAT SCREEN DISPLAY

(75) Inventor: Takaaki Ota, San Diego, CA (US)

(73) Assignee: Sony Corporation, Tokyo (JP)

( * ) Notice: Subject to any disclaimer, the term of this patent is extended or adjusted under 35 U.S.C. 154(b) by 278 days.

(21) Appl. No.: 13/465,124

(22) Filed: May 7, 2012

(65) Prior Publication Data

US 2013/0294017 A1    Nov. 7, 2013

(51) Int. Cl.
- *B29C 65/76* (2006.01)
- *B29C 73/04* (2006.01)
- *B32B 38/10* (2006.01)
- *B32B 43/00* (2006.01)

(52) U.S. Cl.
USPC ........... 156/94; 156/247; 156/285; 156/306.3

(58) Field of Classification Search
USPC ................................. 156/94, 247, 285, 306.3
See application file for complete search history.

(56) References Cited

U.S. PATENT DOCUMENTS

| | | | |
|---|---|---|---|
| 5,592,241 A | 1/1997 | Kita et al. | |
| 6,750,922 B1 | 6/2004 | Benning | |
| 7,065,910 B2 * | 6/2006 | Woodruff | 40/544 |
| 8,243,424 B1 * | 8/2012 | Babu et al. | 361/679.01 |
| 2006/0037794 A1 * | 2/2006 | Riha | 180/90 |
| 2011/0090658 A1 | 4/2011 | Adams et al. | |
| 2011/0102341 A1 * | 5/2011 | Imai et al. | 345/173 |

FOREIGN PATENT DOCUMENTS

| | | | | |
|---|---|---|---|---|
| JP | 2006173638 A | * | 6/2006 | H05K 3/46 |
| JP | 2010256757 A | * | 11/2010 | G09F 9/00 |

OTHER PUBLICATIONS

English Abstract of JP 2006-173638 (Apr. 4, 2014).*
English Abstract of JP 2010-256757 Apr. 4, 2014).*
Machine English Translation of JP 2006-173638 (Apr. 4, 2014).*
Machine English Translation of JP 2010-256757 (Apr. 4, 2014).*

* cited by examiner

*Primary Examiner* — Sing P Chan
(74) *Attorney, Agent, or Firm* — Miller Patent Services; Jerry A. Miller

(57) ABSTRACT

A method consistent with certain implementations involves installing a protective film on a display panel by: placing a sheet of protective film adjacent a front surface of a display panel, where the front surface comprises a surface of the display panel that is displayed when in use, and where the display panel has an edge around a periphery of the display panel; drawing protective film into full contact with the front surface of the display panel; sealing the protective film to the front surface of the display panel at a location at or near the edge of the display panel around the periphery thereof to produce a peripheral sealed edge. The protective film can be drawn into full contact with the display panel by using a vacuum. This abstract is not to be considered limiting, since other embodiments may deviate from the features described in this abstract.

25 Claims, 7 Drawing Sheets

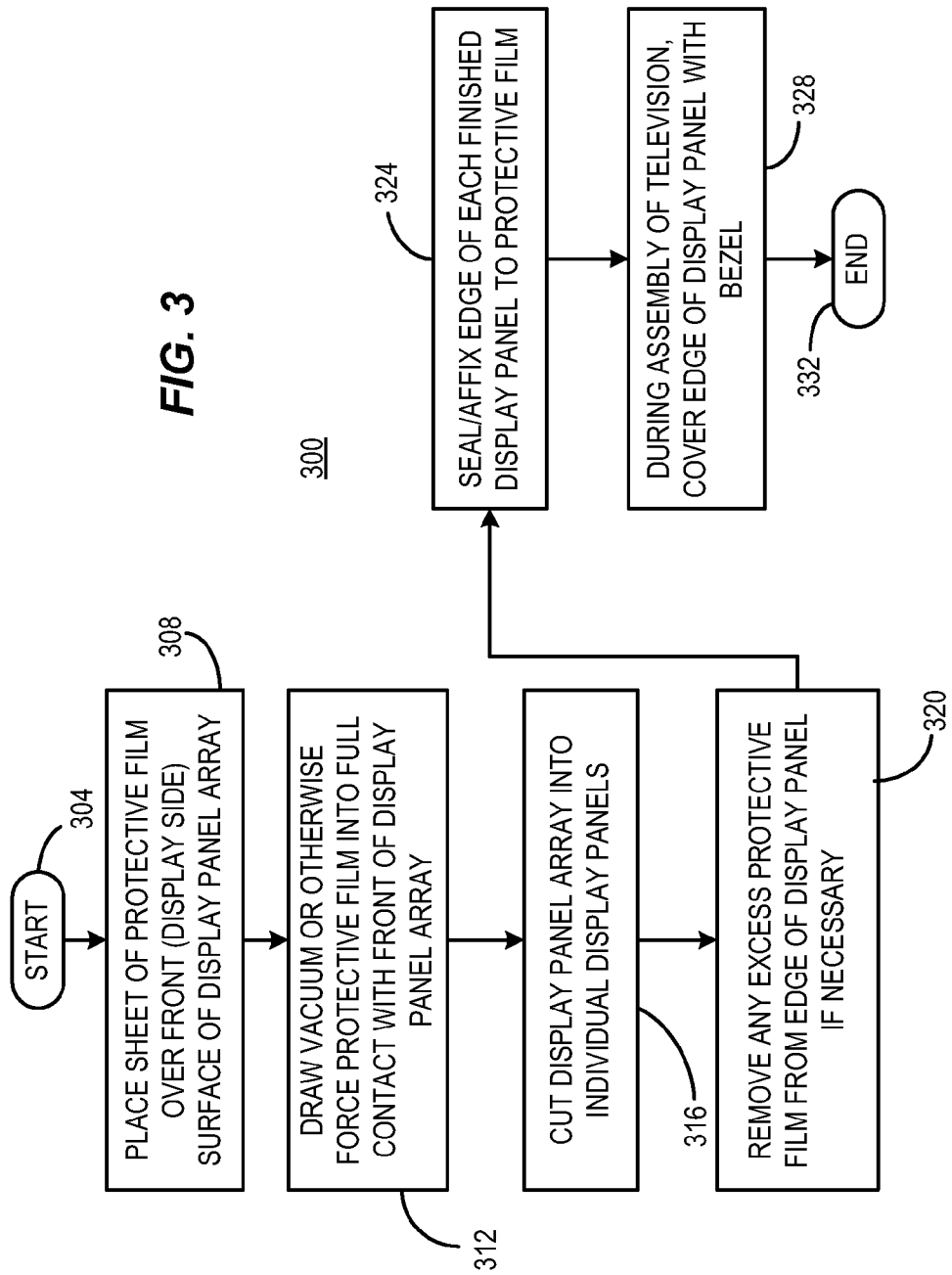

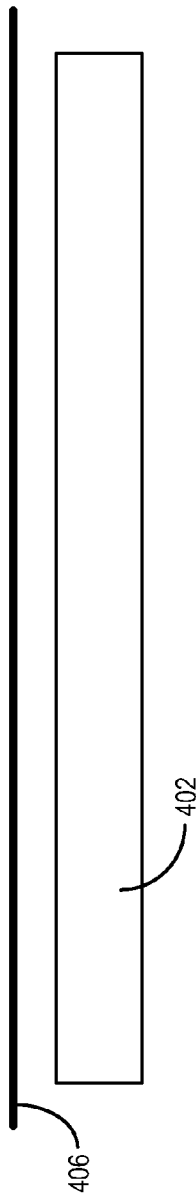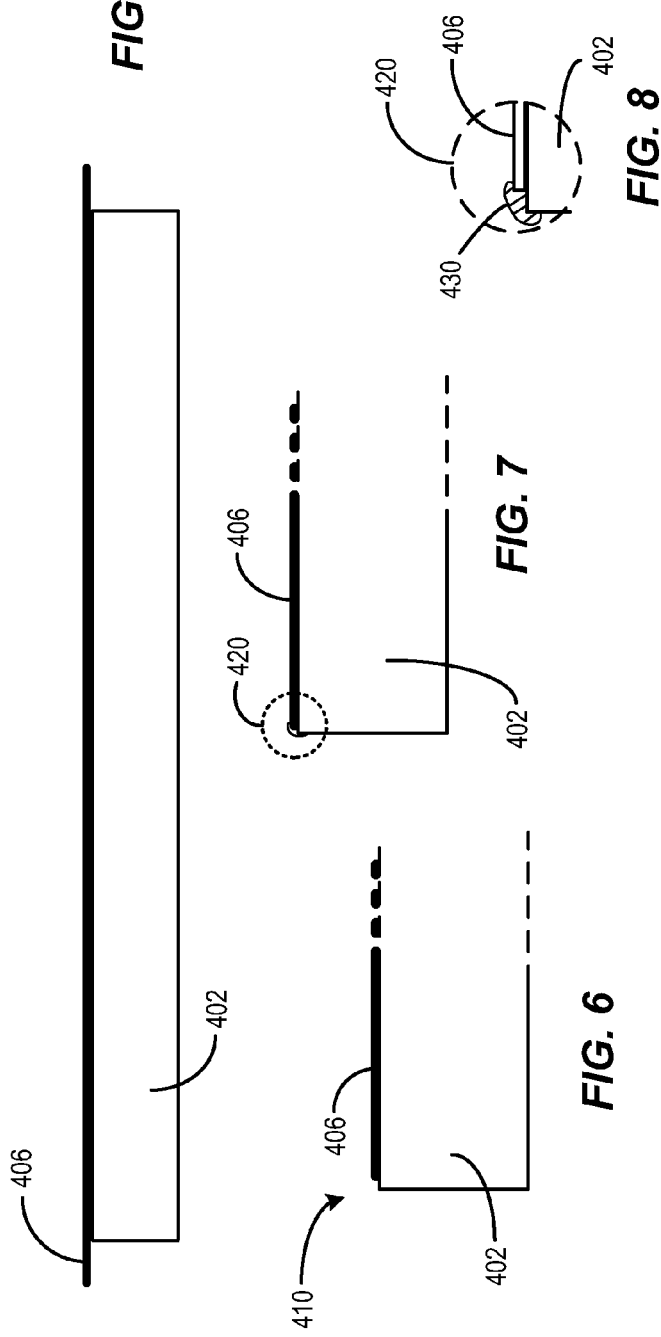

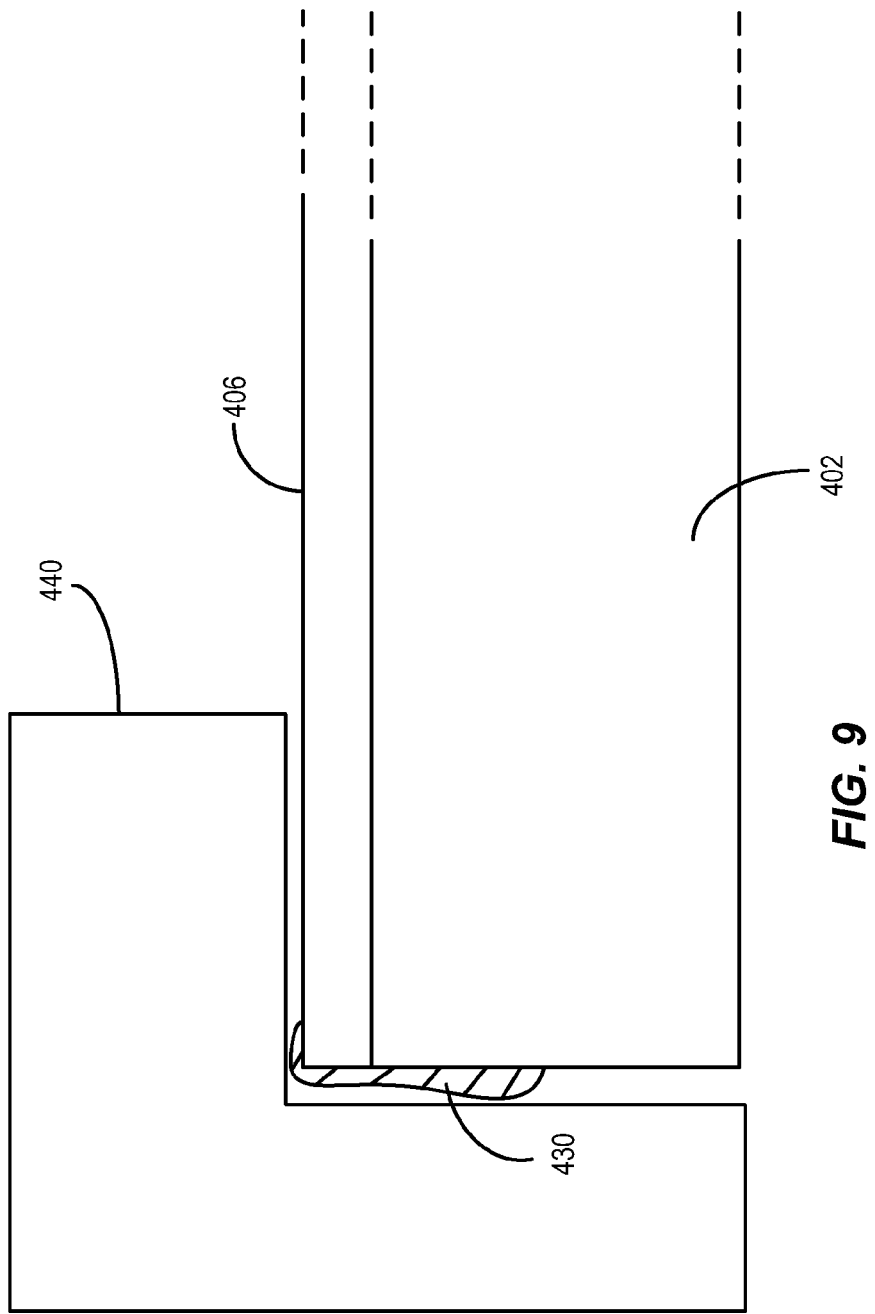

REPLACEABLE PROTECTIVE LAYER ON FLAT SCREEN DISPLAY

COPYRIGHT AND TRADEMARK NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever. Trademarks are the property of their respective owners.

BACKGROUND

When leasing business model is applied to television business it is desirable to design the television (TV) for easy and cheap refurbishing. Even in a situation where the leasing model is not used, refurbishing a TV display is desirable when there is minor cosmetic damage without having to replace the relatively expensive display. Plastic bezels can be easily replaced but a scratched display screen is expensive to replace. This invention adds a thin invisible protective layer on the surface of flat screen display which makes factory refurbishing process easy and less costly.

BRIEF DESCRIPTION OF THE DRAWINGS

Certain illustrative embodiments illustrating organization and method of operation, together with objects and advantages may be best understood by reference to the detailed description that follows taken in conjunction with the accompanying drawings in which:

FIG. 3 is an example of a process for processing an array of display panels in a manner consistent with certain embodiments of the present invention.

FIGS. 4-8 illustrate an example of a portion of the process as described in part in connection with FIG. 1 in a manner consistent with certain embodiments of the present invention.

FIG. 9 is an example illustrating covering of the sealed edge with a bezel in a manner consistent with certain embodiments of the present invention.

DETAILED DESCRIPTION

Figure 2:
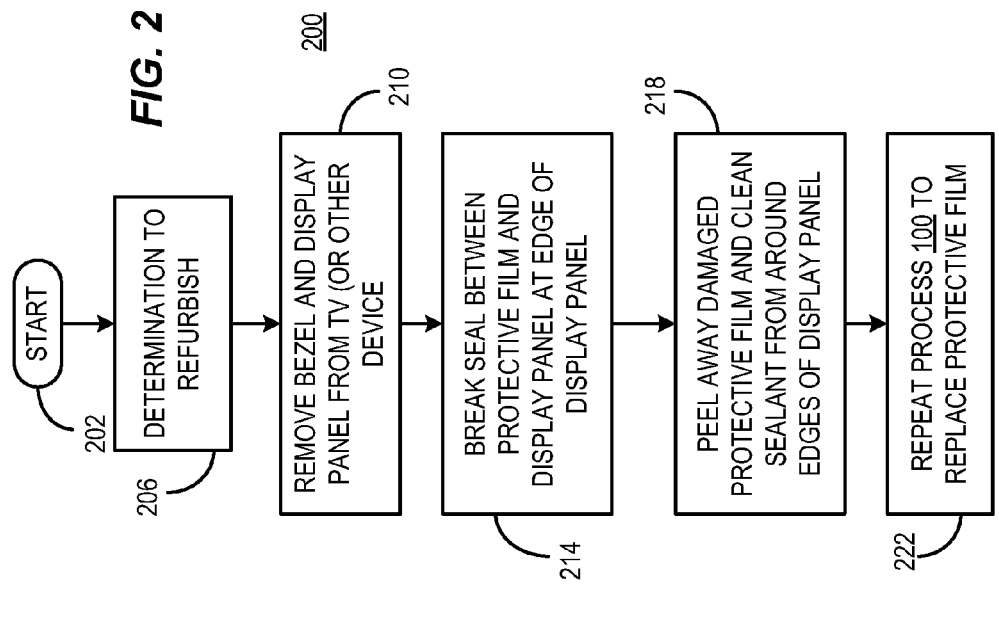
FIG. 2 is an example of a refurbishing process for a display panel consistent with certain embodiments of the present invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

As noted earlier, when leasing business model is applied to television business it is desirable to design the television (TV) for easy and cheap refurbishing. Even in a situation where the leasing model is not used, refurbishing a TV display is desirable when there is minor cosmetic damage without having to replace the relatively expensive display. Plastic bezels can be easily replaced but a scratched display screen is expensive to replace. In accord with certain implementations, a thin invisible protective layer can be added to the surface of flat screen display to make a factory refurbishing process easy and less costly.

While flat screen displays such as LED display panels, LCD display panels, etc. often have a protective coating, the coating is not designed for refurbishing. In accord with certain implementation embodiments a thin plastic layer with scratch resistant coating is placed on top of the outer layer of glass of the display without use of glue. Adhesion is obtained through vacuum (air tight contact) and the sealing at the edge of the screen. When a refurbishment is carried out the edge seal can be broken and then the protective layer can be easily peeled away from the glass surface. A new protective layer can be placed in air tight contact with the front surface of the display and the edges are resealed. In normal use the edge sealing is not accessible or visible due to the edges being covered by the bezel.

The original protective layer can be placed in large scale when the glass is manufactured before a display panel is cut to a specific screen size. This renders the process economical on a large scale in manufacturing compared to placing individual screen size sheet after the glass is cut into pieces. While the present disclosure uses a television display panel as the example implementation, this process can be used with any display panel including those for computer monitors and other devices using a flat display panel.

For purposes of this document the term "vacuum" is not to be considered absolute since an absolute vacuum is not actually required. Rather, "vacuum" is considered as a relative term so that the side of the protective film adjacent the display is under less pressure than the opposite surface of the protective film so as to draw the film into full contact with the display panel's front surface. "Full contact" for purposes of this document means substantially full contact such that no visible gas bubbles remain between the display panel surface and the protective film surface when a viewer is viewing images displayed on the display panel. Additionally, for purposes of this document, the term "drawing the protective film into full contact with the front surface" should be broadly interpreted to mean any process that pulls the film into full contact with the front surface. This could include processes that utilize rollers, presses or other mechanisms to achieve the full contact without bubbles as desired and described above. So, the two surfaces can be drawn together using rollers that press the film into place (in full contact) from one end to the other within the meaning of the above term.

Many types of protective film layers can be used to protect the front surface of the display panel. For example, the protective film layer can be made of clear durable polymer material in a single layer or multilayer on a clear substrate material having a total thickness of approximately 0.1 mm or less, but these preferences are not to be considered limiting. It is also possible to place the substrate on the screen surface (i.e., glass) first and then grow or coat the protective polymer layer on the substrate after the substrate is affixed to the display panel surface. Other variations will occur to those skilled in the art upon consideration of the present teachings.

Figure 1:
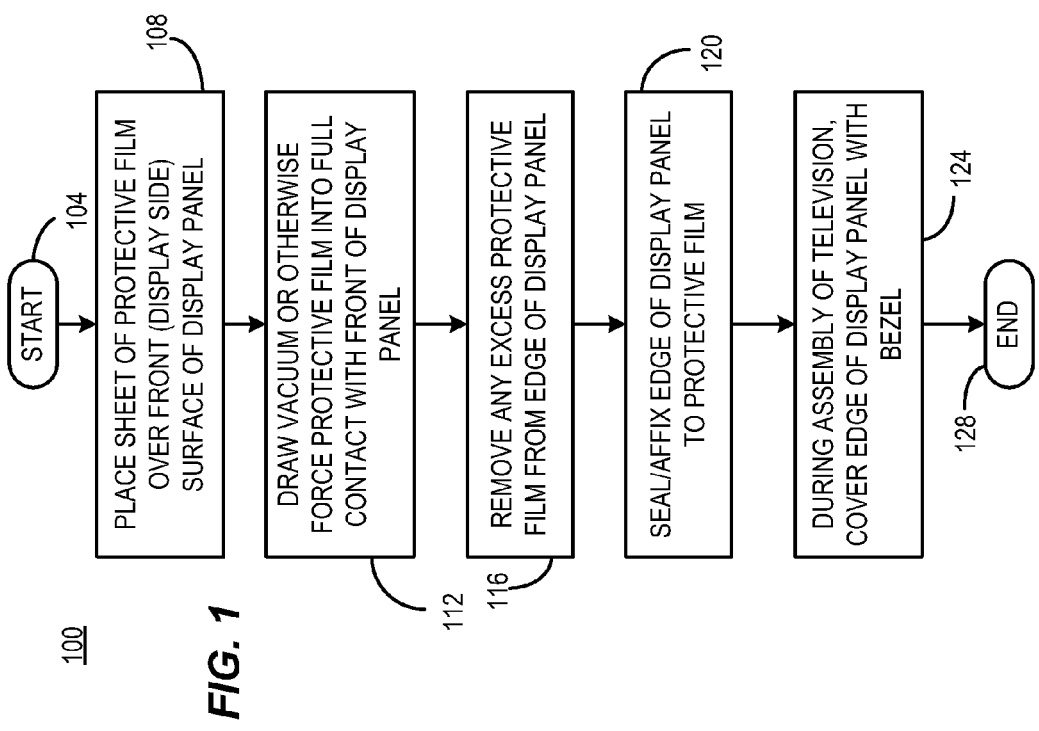
FIG. 1 is an example of a process flow for processing a single display panel in a manner consistent with certain embodiments of the present invention.

Turning now to FIG. 1, a process 100 for applying a protective film to a display panel is presented starting at 104 after which a sheet of protective film is placed over the front surface (the display side) of the display panel at 108. The space between the display panel's front surface and the protective sheet is then exposed to a vacuum compared to the other side of the protective film at adequate pressures to draw the film into full contact with the front surface of the display panel at 112. Preferably, the film will remain in place due to static attraction once drawn into position by the vacuum. At this point, any excess protective film can be cut from the display panel adjacent to or at the edge of the display panel at 116. To assure that the protective film remains in substantially full contact with the display panel, the protective film is affixed to display panel about the peripheral edge thereof at 120 using a sealant such as a bead of sealant, an adhesive, a glue, an epoxy, or these materials prepared on the surface of a flexible substrate material as a form of adhesive tape. This peripheral edge and associated sealant is then ready for assembly into the final product such as a TV display or computer monitor. In such installation, the sealant is covered by a front panel bezel or equivalent structure so that it is obscured from view of the user at 124 and the process ends at 128.

Referring to FIG. 2, if the panel's protective film surface is damaged, refurbishing can be readily carried out using the process 200 starting at 202. When a determination is made to refurbish the display panel at 206, the final product is disassembled to the extent needed to remove the bezel covering the sealant and remove the display panel at 210. The damaged protective film surface can then be removed from the display panel by breaking or cutting the seal around the periphery of the display panel at 214 and peeling away the damaged protective film at 218. It may be desirable to clean off any residual sealant around the edge of the display too. At this point, the display panel is in condition to have a new protective film applied. This is done at 222 by repeating the process 100 of FIG. 1. In a field operation it may be possible to substitute a process that uses rollers or otherwise removes air bubbles from between the interface of the film and the front surface of the display for the vacuum drawing.

In a production environment, often display panels are fabricated in arrays of two or more panels that are fabricated together and then cut apart into individual display panels. FIG. 3 depicts process 300 starting at 304 in which an array of multiple display panels are processed in the manner described above. At 308, a sheet of protective film is placed over the front surface of the display panel array and a vacuum is drawn at 312 to bring the protective sheet into full contact with the front of the display panel array much the same as in process 100 except that an array of display panels is processed simultaneously. At 316, the display panel array is cut into individual panels with the protective film in place. This can be done as a single cutting operation, or the protective film can first be cut and the display panel scored and broken or sawed after the protective film is cut. Such cuts are along lines that will become the perimeter of the finished display panel. In the event any excess film is present at the edge of the separated display panels at 320, such excess can be cut away at this point. Each individual display panel is then processed at 324 by application of a sealant as in process 100 about the perimeter of the display panel to prevent the protective film from peeling away from the display panel. Each individual display panel is then assembled into its final product with a bezel or other equivalent assembly covering the sealed edges of the display panel at 328 and the process ends at 332. In the event refurbishing is needed on panels assembled in accord with process 300, the panel can be processed using process 200 in the same manner as if the panel was individually sealed as in process 100.

Process 100 is depicted in part in FIGS. 4-8, where the display panel 402 and protective film 406 are shown in side view in FIG. 4. In FIG. 5, the protective film 406 is drawn into full contact with display panel 402 so as to eliminate any visible air bubbles. This is carried out in one implementation by use of differential pressure such that a relative vacuum is created between the display panel 402 and the protective film 406. For purposes of illustration, FIG. 5 shows a portion of the protective film 406 overhanging an edge of the display panel 402. In this event, the excess protective film can be trimmed or cut at or adjacent the edge of the display panel as depicted at area 410 in FIG. 6.

The cut edge is sealed as shown in the inset 420 of FIG. 7 which is shown in enlargement of the inset 420 in FIG. 8 where the edge of the protective film 406 and the edge of display panel 402 are covered by a bead of sealant 430.

Once the edge has been sealed, the sealed edge is covered in the assembly process by a bezel or other front panel assembly that covers the edge as depicted in FIG. 9. In this figure, the cut edge of the protective film 406 is shown aligned with the edge of the display panel 402 and the sealant 430 along with the edges of the display panel 402 and the protective film 406 are covered up by bezel 440. In this figure, the relative sizes are highly exaggerated for illustrative purposes.

Figure 10:
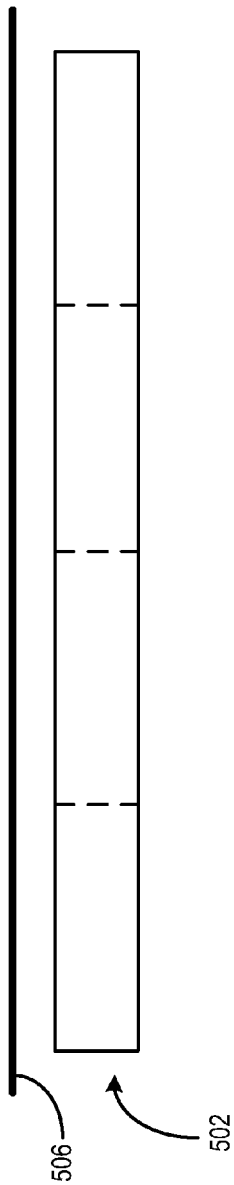
FIGS. 10-13 illustrate an example of a portion of the process as described in FIG. 3 in a manner consistent with certain embodiments of the present invention.
Figure 11:
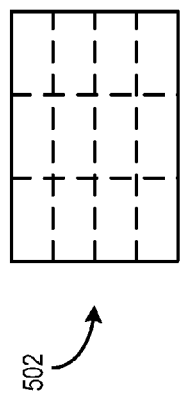
Figure 13:
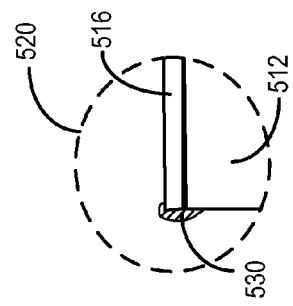
Figure 12:
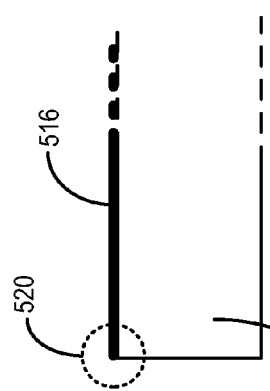

Production process 300 is depicted in part in FIGS. 10-13. FIG. 10 is a view analogous to FIG. 4 showing the edges of the display panel array 502 and protective film 506. Also shown in dashed lines are the location of individual display panels that will later in the process be separated into individual display panels from the array 502. FIG. 11 shows a plan view of the exemplary display panel array 502 that is shown divided into 12 individual display panels. Once separated into individual display panels such as 512, of FIG. 12 the display panel has its own protective film such as 516 similar to that shown in FIG. 6. An inset 520 is shown in an enlarged view in FIG. 13. In this illustration, the cut is such that the edge of the display panel and the protective film are approximately flush such and this edge is shown sealed with a bead of sealant 530 in FIG. 13. Once the edges are sealed, they can be hidden by the bezel when assembled as shown in FIG. 9.

Figure 14:
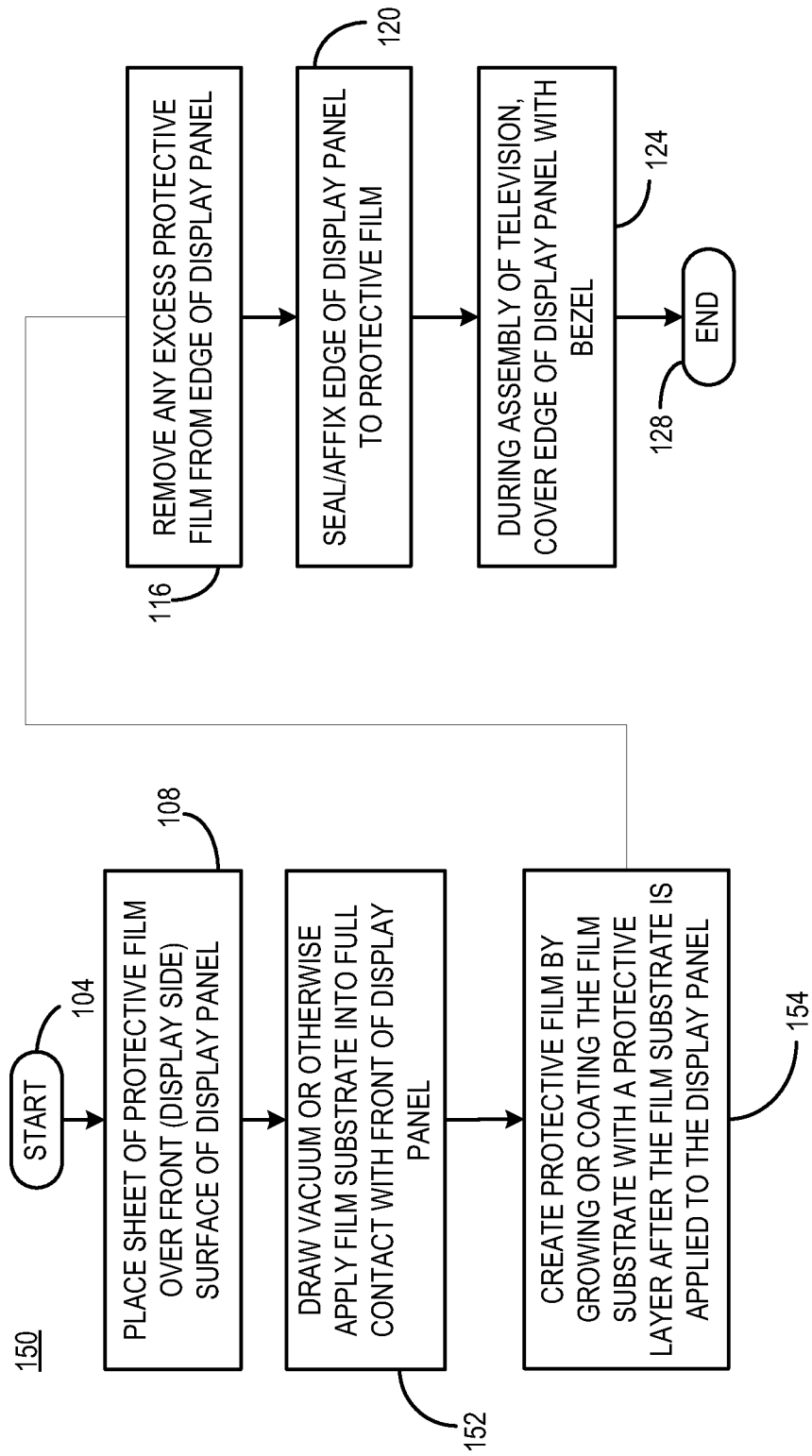
FIG. 14 is an example of a variation of process 100 consistent with certain embodiments of the present invention.

FIG. 14 depicts a variation of the process 100 of FIG. 1 depicted as process 150. In this process, like process blocks correspond to those having the same numbers as the blocks of FIG. 1. However, in this alternative, a substrate is applied to the front surface of the display, either in the manner described above or using a pre-formed substrate at 152. The protective film is then formed in place by coating the substrate with a protective coating (e.g., sprayed or otherwise applied) or by growing a protective coating on the substrate at 154. This protective coating forms a durable polymer layer on top of the plain substrate to provide for protection of the display surface against damage.

Figure 15:
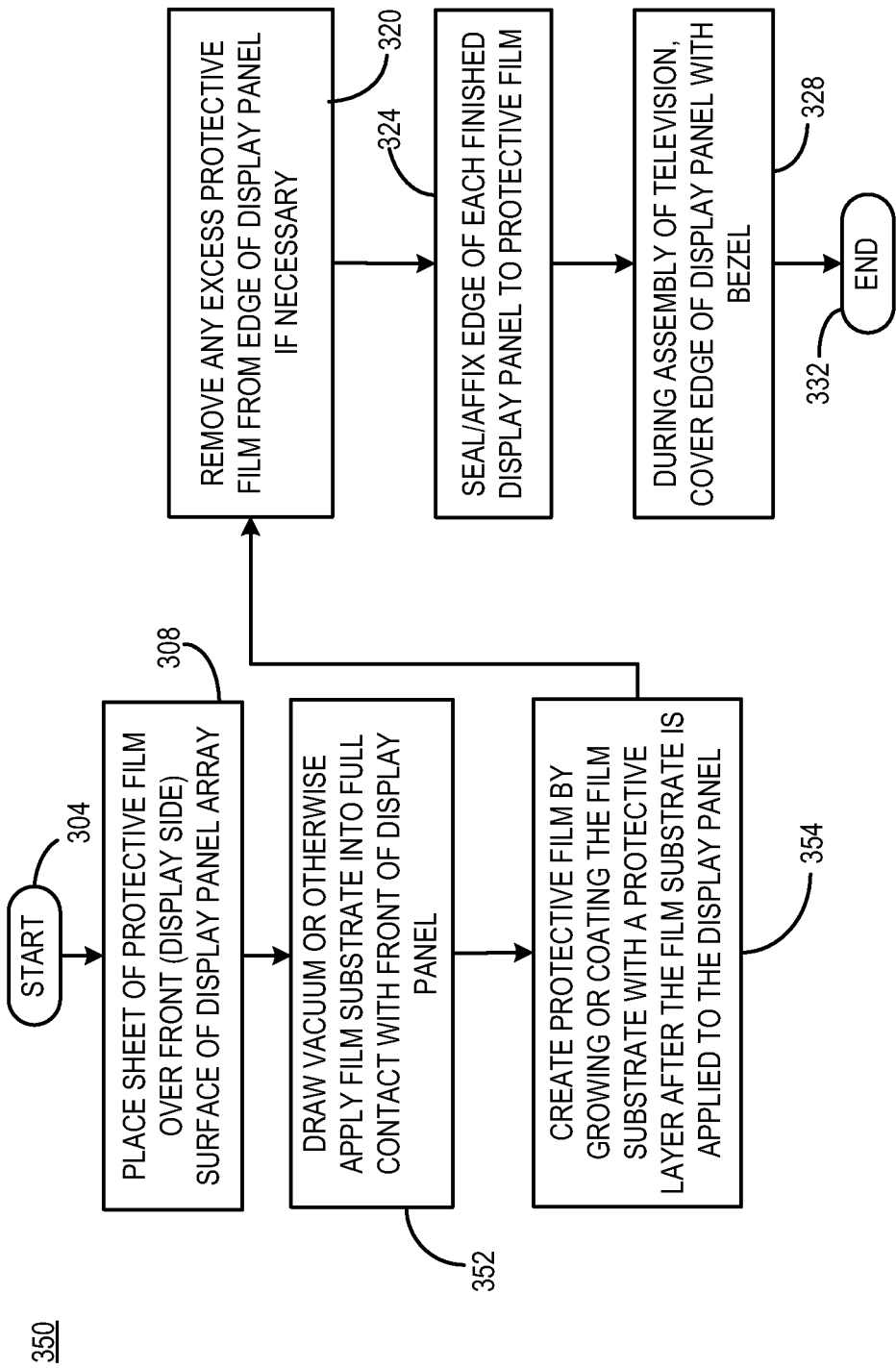
FIG. 15 is an example of a variation of process 300 consistent with certain embodiments of the present invention.

FIG. 15 depicts a variation of the process 300 of FIG. 3 depicted as process 350. In this process, like process blocks correspond to those having the same numbers as the blocks of FIG. 3. However, like process 150, in this alternative, a substrate is applied to the front surface of the display, either in the manner described above or using a pre-formed substrate at 352. The protective film is then formed in place by coating the substrate with a protective coating (e.g., sprayed or otherwise applied) or by growing a protective coating on the substrate at 354. This protective coating forms a durable polymer layer on top of the plain substrate to provide for protection of the display surface against damage.

Those skilled in the art will appreciate that many variations in the present process and actual materials used can be made without departing from implementations consistent with the present teachings.

Thus, a method consistent with certain implementations involves installing a protective film on a display panel by: placing a sheet of protective film adjacent a front surface of a display panel, where the front surface comprises a surface of the display panel that is displayed when in use, and where the display panel has an edge around a periphery of the display panel; drawing protective film into full contact with the front surface of the display panel; sealing the protective film to the front surface of the display panel at a location at or near the edge of the display panel around the periphery thereof to produce a peripheral sealed edge.

In certain implementations, the protective film is drawn into full contact with the display panel by using a vacuum. In certain implementations, a refurbishment can begin by uninstalling the protective film by breaking the seal at or near the edge of the display panel and removing the protective film from the front panel and proceed with reinstalling a replacement protective film by repeating the placing, drawing and sealing using a replacement sheet of protective film. In certain implementations, the display panel is installed into a housing and covering the peripheral sealed edge with a bezel. In certain implementations, the sealing comprises applying a sealing compound, adhesive or tape around the periphery of the display panel to seal an edge of the protective sheet to the display panel. In certain implementations, the protective layer can serve as a substrate which is coated with a protective layer or a protective layer is grown on the substrate.

A method of refurbishing a display panel involves providing a display panel having a front surface, where the front surface comprises a surface of the display panel that is displayed when in use, and where the display panel has an edge around a periphery of the display panel; uninstalling a protective film from the display panel by breaking a seal at or near the periphery of the display panel and removing the protective film from the display panel; placing a sheet of replacement protective film adjacent the front surface of the display panel; drawing the replacement protective film into full contact with the front surface of the display panel; and sealing the protective film to the front surface of the display panel at a location at or near the edge of the display panel around the periphery thereof to produce a peripheral sealed edge.

In certain implementations, the protective film is drawn into full contact with the display panel by using a vacuum. In certain implementations, a refurbishing can begin by removing the display panel from a housing by uninstalling the display panel from the housing where the peripheral sealed edge is covered with a bezel when the display is in the housing. In certain implementations, the sealing comprises applying a sealing compound, adhesive or tape around the periphery of the display panel to seal an edge of the protective sheet to the display panel. In certain implementations, the protective layer can serve as a substrate which is coated with a protective layer or a protective layer is grown on the substrate.

Another method involves installing a protective film on a display panel by: placing a sheet of protective film adjacent a front surface of an array of display panels, where the front surface comprises a surface of the display panels that are displayed when in use, and where each display panel in the array has an edge around a periphery of the display panel; drawing the protective film into full contact with the front surface of the array of display panels; cutting the array of display panels into a plurality of individual display panels; and sealing the protective film to the front surface of each of the plurality of display panels at a location at or near the edge of the display panel around the periphery thereof to produce a peripheral sealed edge of each display panel.

In certain implementations, the protective film is drawn into full contact with the display panel by using a vacuum. In certain implementations, the process continues with installing one of the display panels into a housing and covering the peripheral sealed edge with a bezel. In certain implementations, the sealing comprises applying a sealing compound, adhesive or tape around the periphery of the display panel to seal an edge of the protective sheet to the display panel. In certain implementations, the protective layer can serve as a substrate which is coated with a protective layer or a protective layer is grown on the substrate.

A display panel assembly produced in accord with certain implementations has a flat display panel having a front surface configured to display images and a peripheral edge surrounding the front surface. A protective film is disposed upon and in full contact with the front surface of the flat display panel. A sealant seals the protective film to the flat display panel about the peripheral edge of the flat display panel. In certain implementations a bezel that covers the sealant to obscure the sealant from view. In certain implementations, the sealant comprises a sealing compound, adhesive or tape such as an adhesive tape. In certain implementations, the protective layer can serve as a substrate which is coated with a protective layer or a protective layer is grown on the substrate.

While certain illustrative embodiments have been described, it is evident that many alternatives, modifications, permutations and variations will become apparent to those skilled in the art in light of the foregoing description.

What is claimed is:

1. A method, comprising:
   installing a protective film having an upper edge surface on a display panel by:
   placing a sheet of protective film adjacent a front surface of a display panel, where the front surface comprises a surface of the display panel that is displayed when in use, and where the display panel has an edge surface around a periphery of the display panel;
   drawing protective film into full contact with the front surface of the display panel;
   sealing the protective film to the front surface of the display panel at a location at or near the edge of the display panel around the periphery thereof by applying an edge sealing composition to the edge surface of the display panel and the upper edge surface of the protective film to produce a peripheral sealed edge.

2. The method according to claim 1, where the protective film is drawn into full contact with the display panel by using a vacuum.

3. The method according to claim 1, further comprising:
uninstalling the protective film by breaking the seal at or near the edge of the display panel and removing the protective film from the front panel.

4. The method according to claim 3, further comprising:
reinstalling a replacement protective film by repeating the placing, drawing and sealing using a replacement sheet of protective film.

5. The method according to claim 4, further comprising installing the display panel into a housing and covering the peripheral sealed edge with a bezel.

6. The method according to claim 1, where the sealing comprises applying a sealing compound around the periphery of the display panel to seal an edge of the protective sheet to the display panel.

7. The method according to claim 1, where the edge sealing composition comprises an adhesive.

8. The method according to claim 1, where the edge sealing composition comprises an adhesive tape.

9. The method according to claim 1, where the protective film forms a substrate and further comprising growing or coating a protective layer on the protective film.

10. The method according to claim 1, where in drawing the protective film into contact with the surface of the display, the protective film is held to the front surface of the display panel by static attraction without use of an adhesive between the front surface of the display panel and the protective film.

11. A method of refurbishing a display panel, comprising:
providing a display panel having a front surface, where the front surface comprises a surface of the display panel that is displayed when in use, and where the display panel has an edge surface around a periphery of the display panel;
uninstalling a protective film from the display panel by breaking a seal at or near the periphery of the display panel and removing the protective film from the display panel;
placing a sheet of replacement protective film adjacent the front surface of the display panel;
drawing the replacement protective film into full contact with the front surface of the display panel; and
sealing the protective film to the front surface of the display panel at a location at or near the edge of the display panel around the periphery thereof by applying an edge sealing composition to the edge surface of the display panel and the upper edge surface of the protective film to produce a peripheral sealed edge.

12. The method according to claim 11, where the protective film is drawn into full contact with the display panel by using a vacuum.

13. The method according to claim 11, further comprising uninstalling the display panel from the housing, where the peripheral sealed edge is covered with a bezel when the display is in the housing.

14. The method according to claim 11, where the sealing comprises applying a sealing compound around the periphery of the display panel to seal an edge of the protective sheet to the display panel.

15. The method according to claim 11, where the edge sealing composition comprises an adhesive.

16. The method according to claim 11, where the edge sealing composition comprises an adhesive tape.

17. The method according to claim 11, where the protective film forms a substrate and further comprising growing or coating a protective layer on the protective film.

18. The method according to claim 11, where in drawing the protective film into contact with the surface of the display, the protective film is held to the front surface of the display panel by static attraction without use of an adhesive between the front surface of the display panel and the protective film.

19. A method, comprising:
installing a protective film on a display panel by:
placing a sheet of protective film adjacent a front surface of an array of display panels, where the front surface comprises a surface of the display panels that are displayed when in use, and where each display panel in the array has an edge surface around a periphery of the display panel;
drawing the protective film into full contact with the front surface of the array of display panels;
cutting the array of display panels into a plurality of individual display panels; and
sealing the protective film to the front surface of each of the plurality of display panels at a location at or near the edge of the display panel around the periphery thereof by applying an edge sealing composition to the edge surface of the display panel and the upper edge surface of the protective film to produce a peripheral sealed edge of each display panel.

20. The method according to claim 19, where the protective film is drawn into full contact with the display panel by using a vacuum.

21. The method according to claim 19, further comprising installing one of the display panels into a housing and covering the peripheral sealed edge with a bezel.

22. The method according to claim 19, where the sealing comprises applying a sealing compound around the periphery of the display panel to seal an edge of the protective sheet to the display panel.

23. The method according to claim 19, where the edge sealing composition comprises at least one of an adhesive and an adhesive tape.

24. The method according to claim 19, where the protective film forms a substrate and further comprising growing or coating a protective layer on the protective film.

25. The method according to claim 19, where in drawing the protective film into contact with the surface of the display, the protective film is held to the front surface of the display panel by static attraction without use of an adhesive between the front surface of the display panel and the protective film.

* * * * *